United States Patent
Chen et al.

(10) Patent No.: US 8,349,628 B2
(45) Date of Patent: Jan. 8, 2013

(54) METHODS OF FABRICATING LIGHT EMITTING DIODE DEVICES

(75) Inventors: Yung-Chang Chen, Hsinchu (TW); Hsin-Hsien Wu, Hsinchu (TW); Chyi Shyuan Chern, Taipei (TW); Ching-Wen Hsiao, Hsinchu (TW); Fu-Wen Liu, Hsinchu County (TW); Kuang-Huan Hsu, Hsinchu (TW)

(73) Assignee: TSMC Solid State Lighting Ltd., Hsin-Chu (TW)

( * ) Notice: Subject to any disclaimer, the term of this patent is extended or adjusted under 35 U.S.C. 154(b) by 113 days.

(21) Appl. No.: 13/053,701

(22) Filed: Mar. 22, 2011

(65) Prior Publication Data
US 2012/0244652 A1    Sep. 27, 2012

(51) Int. Cl.
*H01L 21/00*    (2006.01)

(52) U.S. Cl. .................. 438/27; 257/E33.061

(58) Field of Classification Search .................. None
See application file for complete search history.

(56) References Cited

U.S. PATENT DOCUMENTS

| | | |
|---|---|---|
| 2009/0179207 A1 | 7/2009 | Chitnis et al. |
| 2010/0216265 A1 | 8/2010 | Fan et al. |
| 2011/0215355 A1* | 9/2011 | van de Ven et al. ............. 257/98 |

* cited by examiner

*Primary Examiner* — Seahvosh Nikmanesh
(74) *Attorney, Agent, or Firm* — Haynes and Boone, LLP

(57) ABSTRACT

An embodiment of the disclosure includes a method of fabricating a plurality of light emitting diode devices. A plurality of LED dies is provided. The LED dies are bonded to a carrier substrate. A patterned mask layer comprising a plurality of openings is formed on the carrier substrate. Each one of the plurality of LED dies is exposed through one of the plurality of the openings respectively. Each of the plurality of openings is filled with a phosphor. The phosphor is cured. The phosphor and the patterned mask layer are polished to thin the phosphor covering each of the plurality of LED dies. The patterned mask layer is removed after polishing the phosphor.

20 Claims, 7 Drawing Sheets

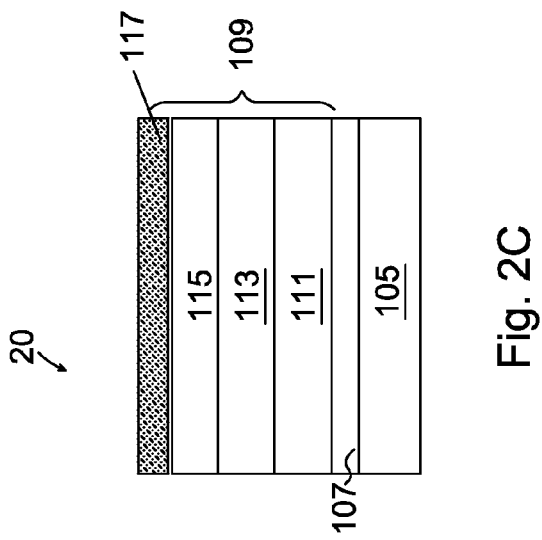
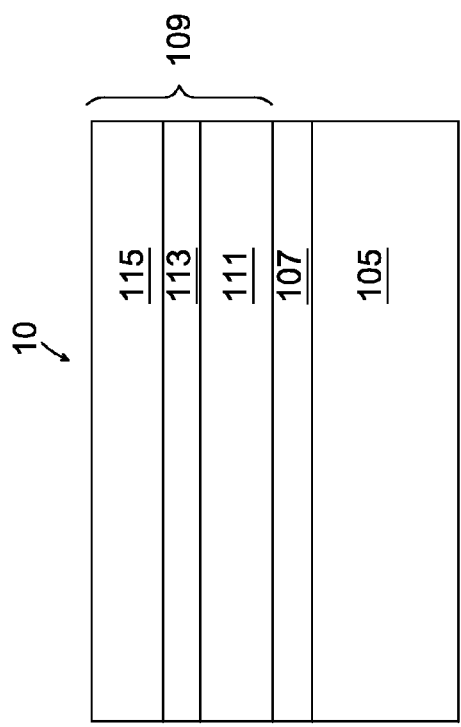
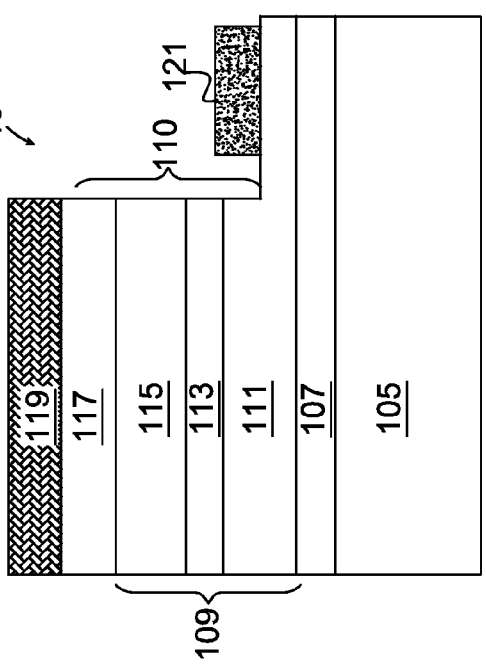

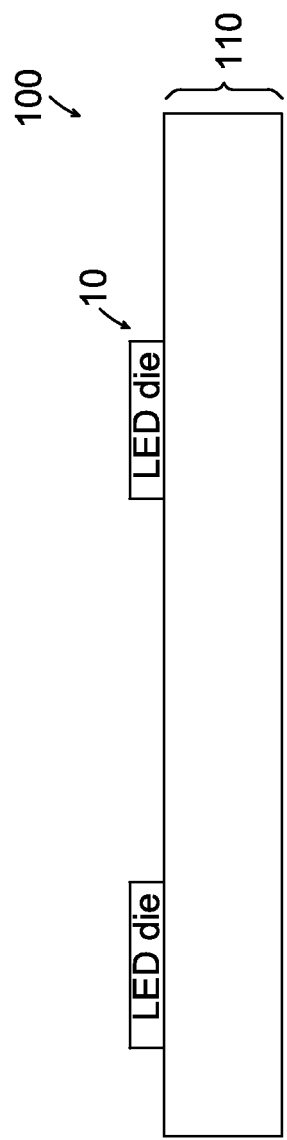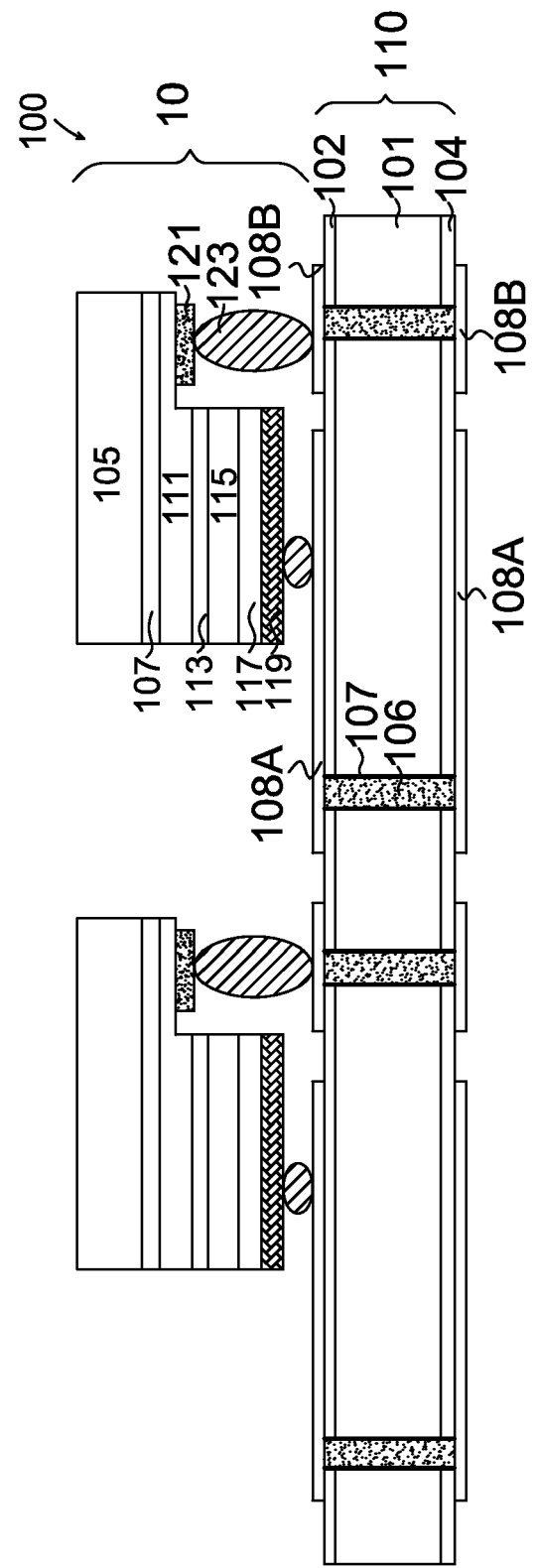

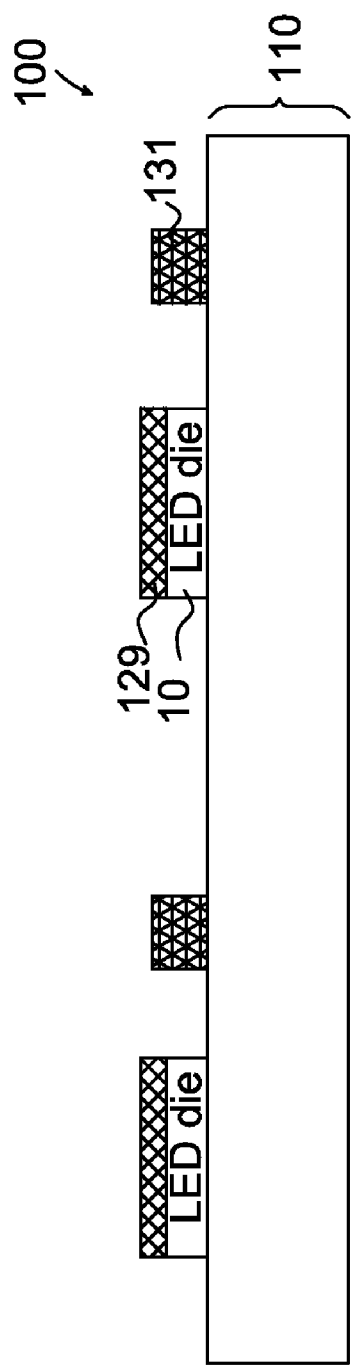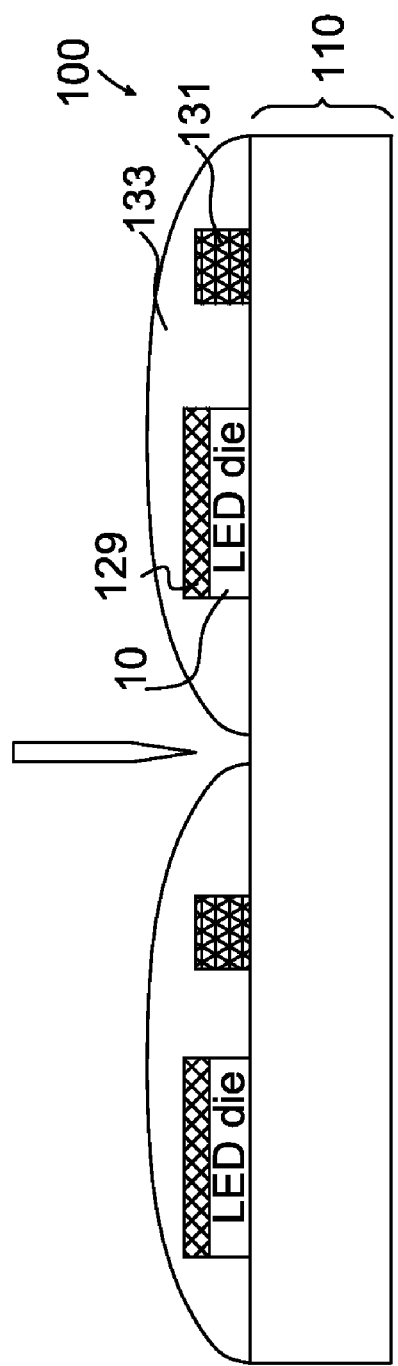

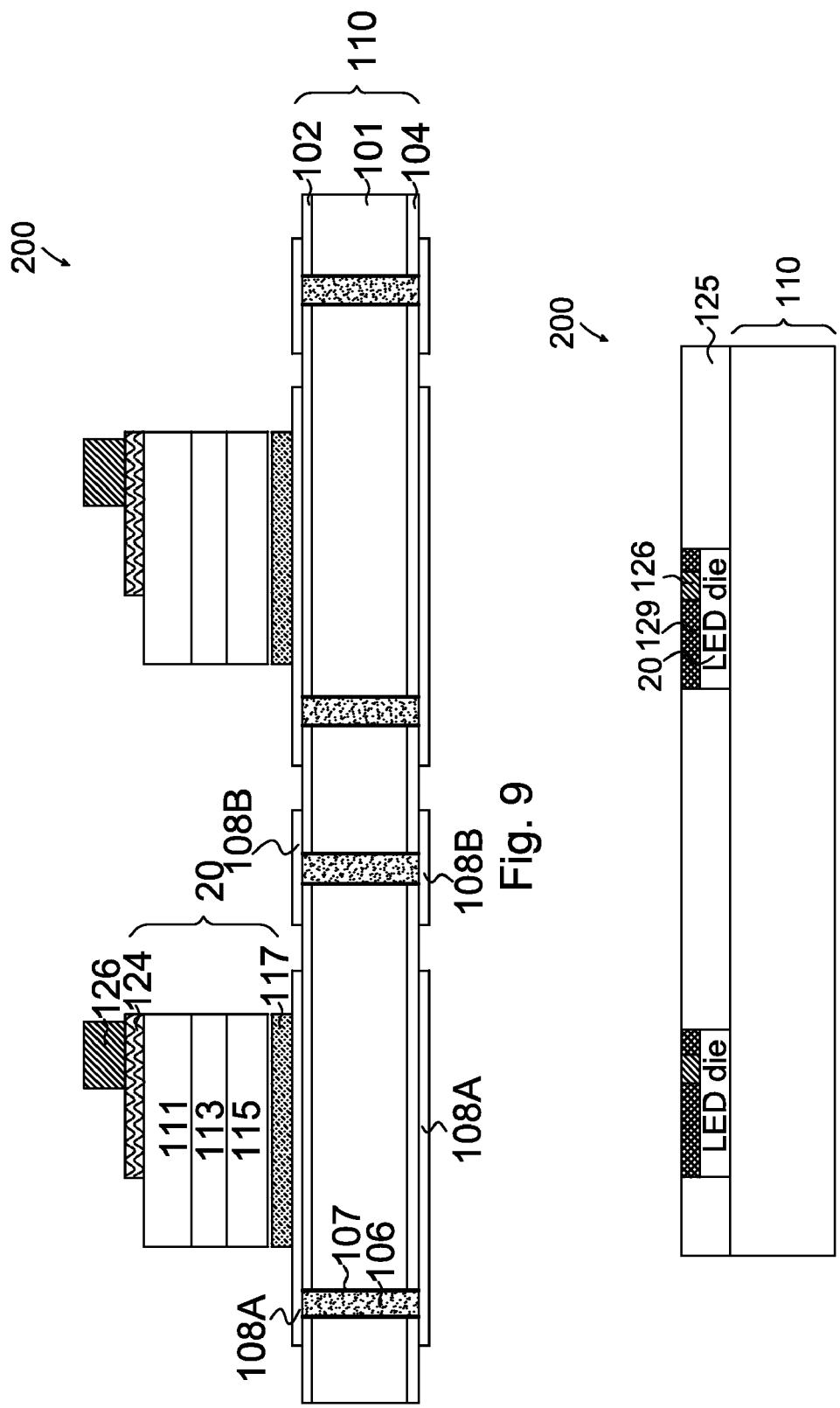

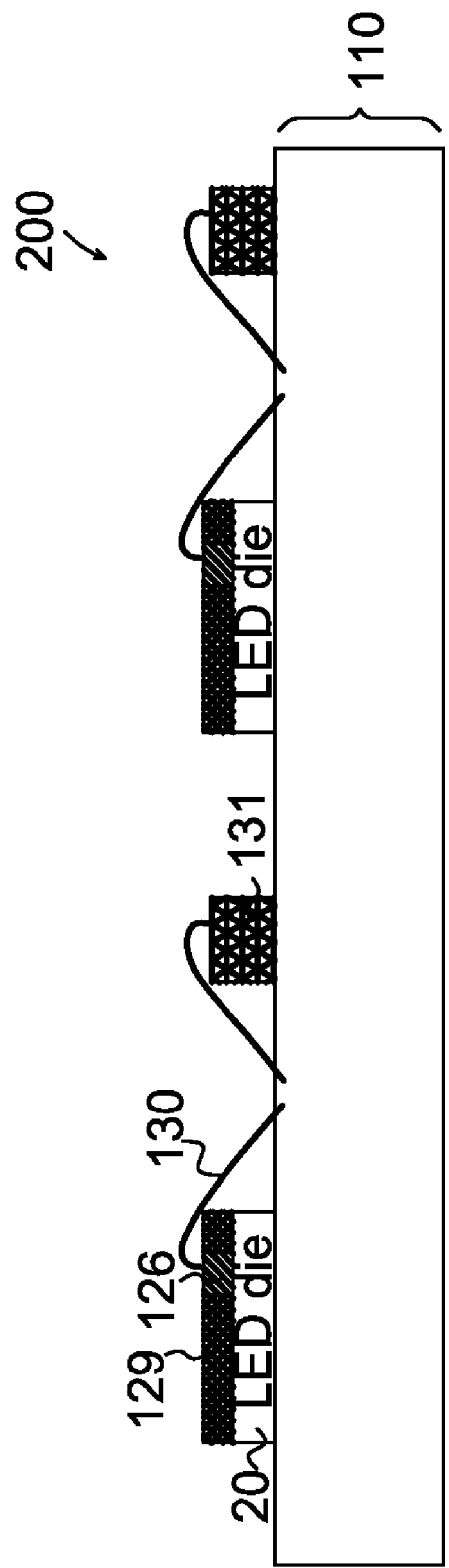

METHODS OF FABRICATING LIGHT EMITTING DIODE DEVICES

TECHNICAL FIELD

The disclosure relates generally to a Light-Emitting Diode (LED) device, and more particularly to a method of fabricating an LED device.

BACKGROUND

Light emitting diodes (LEDs) devices are widely used in various applications such as indicators, signs, light sources, and other types of lighting. LEDs emit light when voltages are applied across a p-n junction. Different wavelengths of light can be generated using different materials by varying the bandgaps of the semiconductor layers and by fabricating an active layer within the p-n junction.

A phosphor material is usually added to change the properties of light generated by the LED. For example, monochromatic light provided by an LED can be converted to polychromatic light through the application of several phosphors, either in a mixture or several phosphor layers. The phosphors Stokes shift property shifts a shorter wavelength light to a longer wavelength. The perception of white light may be evoked by generating mixtures of wavelengths that stimulate all three types of color sensitive cone cells (red, green, and blue) in the human eye in nearly equal amounts and with high brightness compared to the surroundings in a process called additive mixing. A white light LED may be used as lighting, such as back lighting for various display devices, commonly in conjunction with a liquid crystal display (LCD).

The existing methods of forming a phosphor material on an LED device have not been entirely satisfactory in every aspect. For example, more efficient methods and designs that extract more of the light generated and improve light and color distribution continue to be sought. Accordingly, there is a need for an improved method for forming a phosphor material on an LED device.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2A and 2B are cross-sectional views of forming an LED die at various stages of manufacture according to embodiments of the disclosure.

FIG. 2C is a cross-sectional view of another LED die according to one embodiment of this disclosure.

FIGS. 3 to 8 are cross-sectional views of a structure for forming a plurality of LED devices at various stages of manufacture according to one embodiment of the method of FIG. 1.

FIGS. 9 to 11 are cross-sectional views of a structure for forming a plurality of LED devices at various stages of manufacture according to another embodiment of the method of FIG. 1.

DETAILED DESCRIPTION

The making and using of illustrative embodiments are discussed in detail below. It should be appreciated, however, that the disclosure provides many applicable inventive concepts that can be embodied in a wide variety of specific contexts. The specific embodiments discussed are merely illustrative and do not limit the scope of the invention.

Figure 1:
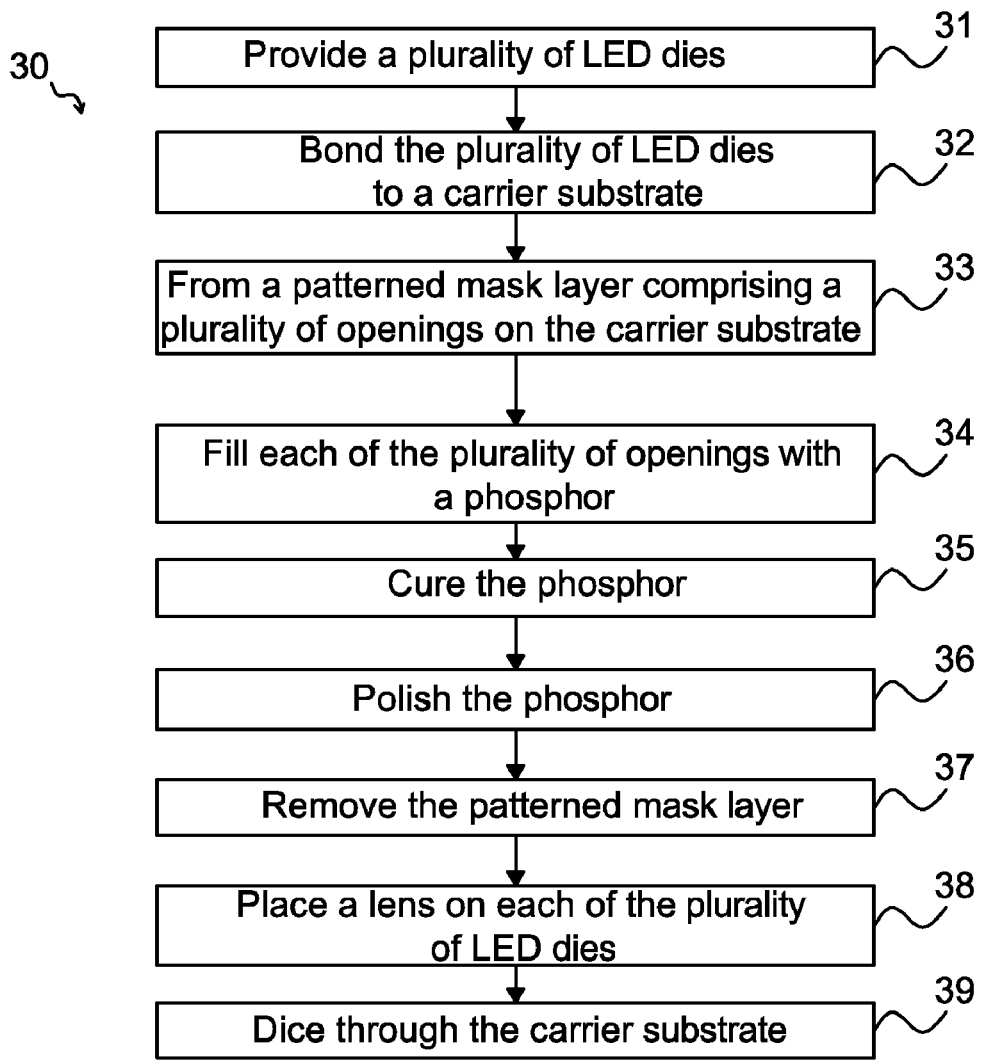
FIG. 1 is a flowchart of a method for fabricating Light-Emitting Diode (LED) devices according to embodiments of the disclosure.

Illustrated in FIG. 1 is a flowchart of a method 30 for fabricating Light-Emitting Diode (LED) devices according to embodiments of the disclosure. FIGS. 2A and 2B are cross-sectional views of forming an LED die, which is incorporated in the method 30, at various stages of manufacture according to embodiments of the disclosure. FIGS. 3 to 8 are cross-sectional views of a structure 100 for forming a plurality of LED devices at various stages of manufacture according to one embodiment of the method 30 of FIG. 1. FIG. 2C is a cross-sectional view of another LED die, which is incorporated in method 30 for forming LED devices in FIGS. 9 to 11. FIGS. 9 to 11 are cross-sectional views of a structure 200 for forming a plurality of LED devices at various stages of manufacture according to another embodiment of the method 30 of FIG. 1.

An LED device may be a part of a display or lighting device having a number of modules, the LEDs in each module being either controlled singly or in combination. The LED may also be a part of an integrated circuit (IC) chip, system on chip (SoC), or portion thereof, that may include various passive and active microelectronic devices such as resistors, capacitors, inductors, diodes, metal-oxide semiconductor field effect transistors (MOSFETs), complementary metal-oxide semiconductor (CMOS) transistors, bipolar junction transistors (BJTs), laterally diffused MOS (LDMOS) transistors, high power MOS transistors, or other types of transistors. It is understood that various figures have been simplified for a better understanding of the inventive concepts of the present disclosure. Accordingly, it should be noted that additional processes may be provided before, during, and after the method 30 of FIG. 1. Some other processes may only be briefly described, and various processes may be substituted for the described processes to achieve the same effect.

Referring now to FIG. 1, method 30 for fabricating LED devices begins with operation 31. At operation 31, a plurality of LED dies are provided. Each LED die includes a light-emitting structure is formed on a growth substrate.

Referring to FIG. 2A, one LED die 10 is provided for illustration. The LED die 10 includes a growth substrate 105, which includes a material that is suitable for growing a light-emitting structure 109. In one embodiment, the growth substrate 105 is sapphire. In other embodiments, the growth substrate 105 may be silicon carbide, silicon, gallium nitride, or another suitable material for growing the light-emitting structure 109.

Next, a buffer layer 107, often comprising gallium nitride or aluminum nitride, is grown on the growth substrate 105 in an epitaxial growth processes. The buffer layer 107 may be about 500 nm to 5 µm, for example, about 2 µm. The light-emitting structure 109 is formed over the buffer layer 107. The light-emitting structure 109 is usually a semiconductor diode capable of emitting light when electricity is conducted across it. In the present embodiment, the light-emitting structure 109 includes a doped layer 111, a multiple quantum well layer (MQW) 113, and a doped layer 115. The doped layers 111 and 115 are oppositely doped semiconductor layers. In some embodiments, the doped layer 111 includes an n-type gallium nitride material, and the doped layer 115 includes a p-type gallium nitride material. In other embodiments, the doped layer 111 may include a p-type gallium nitride material, and the doped layer 115 may include an n-type gallium nitride material. The MQW layer 113 shown in FIG. 2A includes alternating (or periodic) layers of two different compound semiconductor materials, for example, gallium nitride and indium gallium nitride. For example, in one embodiment, the MQW layer 113 includes ten layers of gallium nitride and ten layers of indium gallium nitride, where an indium gallium nitride layer is formed on a gallium nitride layer, and another gallium nitride layer is formed on the indium gallium nitride layer, and so on and so forth. The light emission efficiency of the emitting-structure 109 depends on the number of alternating layers and thicknesses of those layers. The thickness of the MQW layer 113 may be about 10-2000 nm, for example.

In FIG. 2A, the doped layer 111, the MQW layer 113, and the doped layer 115 are all formed by epitaxial growth processes. The layers 111, 113 and 115 are epitaxially grown on the buffer layer 107. The doping may be accomplished by adding impurities into a source gas during the epitaxial growth process or by other doping processes. After the completion of the epitaxial growth process, a p-n junction (or a p-n diode) is essentially formed in the MQW layer 113 between the doped layer 111 and the doped layer 115. When an electrical voltage is applied between the doped layer 111 and the doped layer 115, electrical current flows through the light-emitting structure 109 and the structure 109 emits radiation. The color of the light emitted by the structure 109 is determined by the wavelength of the emitted radiation, which may be "tuned" (or selected) by varying the composition and structure of the materials that make up the emitting-structure 109. For example, a small increase in the concentration of indium in the indium gallium nitride layer in the MQW 113 is associated with a shift of the light's wavelength output toward longer wavelengths.

Referring to FIG. 2B, a mesa structure 110 is defined by photolithography patterning processes and etching processes. The mesa structure 110 is etched from the top surface of the contact layer 117 to expose a middle portion of the doped layer 111. Then, a contact layer 117 is formed on the mesa structure 110. The contact layer 117 may be added on the doped layer 115 to form an ohmic contact.

A light reflecting layer 119 is formed on the contact layer 117 and the exposed surface of the doped layer 111. Then, the light reflecting layer 119 is patterned by photolithography patterning processes and etching process to form a first portion on the contact layer 117 and a second portion 121 on the exposed surface of the doped layer 111. The light reflecting layer 119 is an opaque layer and may reflect the radiation emitting from the light-emitting structure 109. The light reflecting layer 119 may be a metal, such as aluminum, copper, titanium, silver, gold, alloys of these such as titanium/platinum/gold, or combinations thereof. The light-reflecting layer 119 may be formed by a physical vapor deposition (PVD) process, a chemical vapor deposition (CVD) an electroplating process, or other deposition processes. Consequently, the LED die 10 is formed.

Referring back to FIG. 1, method 30 continues with operation 32 in which the plurality of LED dies are bonded to a carrier substrate.

FIG. 3A illustrates the stage of operation 32 in which a cross-sectional view of the structure 100 is provided. The structure 100 includes a plurality of discrete LED dies 10 bonded to the carrier substrate 110. In the present example, only two LED dies 10 are provided for illustration. FIG. 3B is a magnified view of a portion of the structure 100 in FIG. 3A. In this example, the LED die 10 is flipped over and bonded to metal bonding pads 108A and 108B of the carrier substrate 110 by using a solder 123 for electrical connection. In another example, the LED die is not flipped over and is bonded to the carrier substrate with the top surface facing up.

The carrier substrate 110 is designed to provide mechanical strength, electrical coupling and a thermal conductive path for the LED dies 10. In one embodiment, the carrier substrate 110 includes a silicon wafer 101. The carrier substrate 110 further includes thin dielectric films 102 and 104 formed on the top and bottom surfaces of the silicon wafer 101, respectively. The thin dielectric films 102 and 104 may include silicon oxide, silicon nitride, silicon oxynitride, silicon carbide, diamond-like carbon or other suitable dielectric material. In the present embodiment, the thin dielectric films 102 and 104 include silicon oxide and are formed by thermal oxidation, chemical vapor deposition (CVD) or other suitable technique. In another embodiment, the carrier substrate 110 may include ceramic substrate, directed copper bonded substrate, composite substrate and printed circuit board (PCB).

The carrier substrate 110 further includes a plurality of through-silicon vias (TSVs) 106 embedded in the carrier substrate 110. Various TSVs 106 are formed and embedded in the silicon wafer 101 and are configured to provide electrical connection to the LED dies 10. In one embodiment, the TSVs 106 include a conductive material, such as copper or other suitable metal/metal alloy. The TSVs 106 can be formed by a procedure including etching a plurality of vias in the silicon wafer 101 of the carrier substrate 110 and deposition the conductive material to fill the plurality of vias to form TSVs 106. The deposition may include physical vapor deposition (PVD), plating, a combination of PVD and plating, or other suitable technique.

The TSVs 106 may further include a thin dielectric material layer 107 formed on the sidewalls of the vias to separate the TSVs 106 from the silicon wafer 101 for electrical isolation. The thin dielectric material layer 107 may include silicon oxide, silicon nitride, silicon oxynitride, silicon carbide, diamond-like carbon or other suitable dielectric material. In the present embodiment, the thin dielectric material layer 107 includes silicon oxide and is formed by thermal oxidation, CVD or other suitable technique.

The carrier substrate 101 further includes various metal bonding pads 108A and 108B positioned on the top surface and the bottom surface of the silicon wafer 101. The metal bonding pads 108A and 108B the top surface and the bottom surface of the silicon wafer 101 are deposited on the thin dielectric films 102 and 104 respectively. Each of the metal bonding pads 108A and 108B on the same surface of the silicon wafer 101 is separated and is electrically isolated by the thin dielectric films 102 and 104 respectively. The metal bonding pads 108A and 108B on the top surface of the silicon wafer 101 couple to the corresponding metal bonding pads 108A and 108B on the back surface through one of the TSVs 106. The metal bonding pads 108A and 108B function as electrodes of the LED dies 10 at the packaging level. In various embodiments, the metal bonding pads 108A and 108B include metal or metal alloy with good conductive properties, both electrical and thermal, and good bonding properties, such as gold, gold alloy, copper, copper alloy, nickel, nickel alloy, platinum, platinum alloy, titanium, titanium alloy, or combinations thereof.

Referring back to FIG. 1, method 30 continues with operation 33 in which a patterned mask layer is formed on the carrier substrate. The patterned mask layer comprises a plurality of openings. Each of the plurality of LED dies is exposed through one of the plurality of openings respectively.

Figure 4:
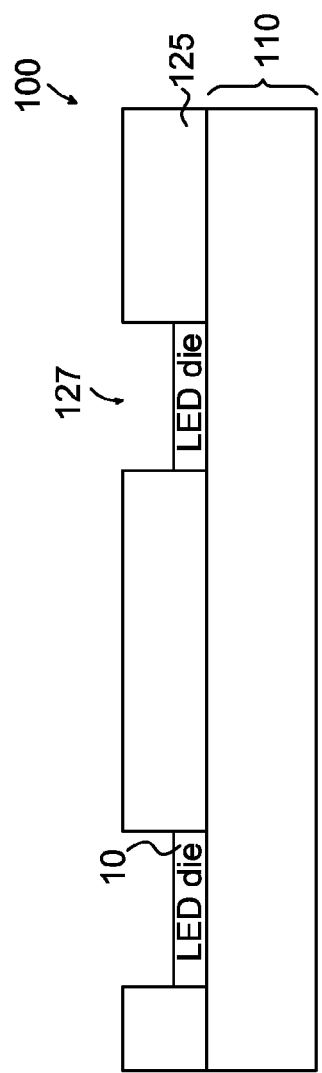

FIG. 4 illustrates the stage of operation 33 in which a cross-sectional view of the structure 100 is provided. In one embodiment, the mask layer 125 comprising a photo resist is formed, and covers the LED dies 10 and the surface of the carrier substrate 110. A patterning method is used to selectively define the plurality of openings 127 in the mask layer 125 to expose the plurality of LED dies 10. The patterning method includes a sequential process including photo resist coating, soft baking, exposing pattern, post-exposure baking, and developing photo resist. In one example, each of the plurality of openings 127 has a width substantially the same as a width of each of the plurality of LED dies 10. Each edge of the LED die 10 is vertically aligned with the interior surface of the opening 127. In another example, each of the plurality of openings 127 has a width larger than a width of each of the plurality of LED dies 10. A portion of the carrier substrate 110 is exposed through the opening 127. In another embodiment, the mask layer may comprise a hard mask layer such as silicon oxide or silicon nitride. The patterning method may use film deposition, lithographic and etching processes.

Referring back to FIG. 1, method 30 continues with operation 34 in which each of the plurality of openings is filled with a phosphor. Thereby, the phosphor covers each of the plurality of LED dies.

Figure 5:
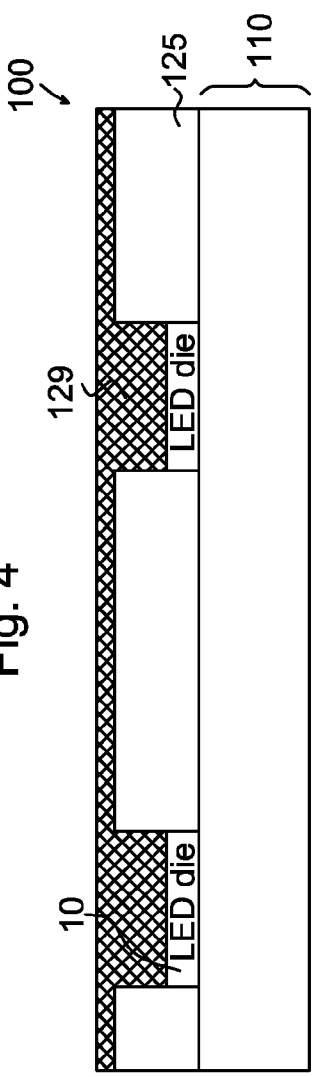

FIG. 5 illustrates the stage of operation 34 in which a cross-sectional view of the structure 100 is provided. In one embodiment, the phosphor 129 is coated to overfill the openings 127 and the top surface of the patterned mask layer 125. In another embodiment, the phosphor 129 fills the opening 127 and does not overfill the top surface of the patterned mask layer 125. The phosphor 129 coating can be applied using different processes such as spin coating, spray coating, dispensing, electrophoretic deposition, electrostatic deposition, printing, jet printing or screen printing. In some embodiments, the phosphor 129 is mixed with a binder. Different materials can be used for the binder, with materials preferably being robust after curing and substantially transparent in the visible wavelength spectrum. Suitable materials for the binder include silicones, epoxies, glass, inorganic glass, spin-on glass, dielectrics, BCB, polyimides, polymers and hybrids thereof.

Referring back to FIG. 1, method 30 continues with operation 35 in which a curing process is operated to solidify the phosphor. The curing evaporates the solvents in the binder and hardens the mixture of the phosphor and the binder. The curing methods depending on different factors such as the type of binder used. Different curing methods include, but are not limited to, heat, ultraviolet (UV), infrared (IR) or air curing. In one embodiment, the phosphor is cured in a temperature from about 50° C. to about 100° C. for about 2 to 10 hours when the photo resist is used as the mask layer. In this temperature, the phosphor could be hardened and the photo resist could be easily to be removed without residues in the following processes.

Referring to FIG. 1, method 30 continues with operation 36 in which the phosphor and the patterned mask layer is polished to thin the phosphor, which covers each of the plurality of LED dies.

Figure 6:
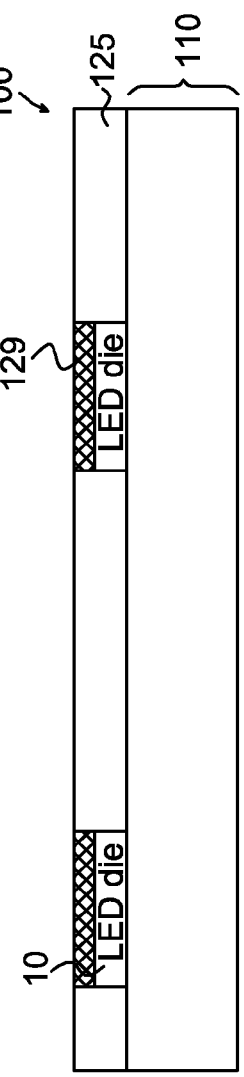

FIG. 6 illustrates the stage of operation 36 in which the structure 100 shown in FIG. 5 is polished. The excess phosphor 129 outside of the openings 127 and the patterned mask layer 125 is removed through a polishing process. The phosphor 129 and the mask layer 125 are thinned simultaneously to a predetermined thickness. Advantageously, the openings 129 in the pattered mask layer 125 prevent the phosphor 129 flowing over the entire carrier substrate 110 while the phosphor 129 is not hard enough. During the polishing process, the phosphor 129 over each LED die 10 is confined within each opening 129.

In one embodiment, the polishing process includes attaching the carrier substrate 110 to a handle carrier (not shown). Then, the phosphor 129 and the patterned mask layer 125 are pressed through the handle carrier to a rotating polish pad. The rotating speed of the polish pad is about 20 rpm to about 30 rpm with a 3M sand paper. This polishing process could be performed by a system, which is offered by SpeedFam of Kanagawa, Japan.

After the polishing, a uniform thickness of the polished phosphor 125 is controlled within a range of about 10 µm to about 100 µm. The thickness uniformity of the polished phosphor 125 on each LED die 10 within the carrier substrate 110 is less than 5%. With the accurate control of the phosphor thickness and the uniformity, the LED devices on the carrier substrate 110 emit light at the same or similar wavelengths of light. This results in tightly binned LED devices on the same carrier substrate.

Referring back to FIG. 1, method 30 continues with operation 37 in which the patterned mask layer is removed. The patterned mask layer may be removed by dry etching or wet etching.

Referring to FIG. 7, a protection circuit 131 is optionally bonded to the carrier substrate 110 after the patterned mask layer 125 is removed. The protection circuit 131 is parallel connected to the LED die 10. In one embodiment, the protection circuit 131 is wire connected to a contact pad (not shown) in the carrier substrate 110 and electrically connects to the LED die 10. In other embodiment, a contact pad (not shown) of the protection circuit 131 is directly bonded to a contact pad (not shown) in the carrier substrate 110. Through the interconnect routes (not shown) in the carriers substrate 110, an electrical connection loop between the LED die 10 and the protection circuit 131 is completed.

LEDs are electronic components that are sensitive to both external sources of overvoltage transients such as electrostatic discharge (ESD) and electrical fast transients (EFT). Various protections circuits may be added to the LED package to protect the LED die in an overvoltage transient event. Particularly, Zener diodes are commonly used to protect fragile LEDs against an ESD surge. A Zener diode is a type of diode that permits current not only in the forward direction like a normal diode, but also in the reverse direction if the voltage applied is larger than the breakdown voltage. Zener diodes are connected to the LED die in parallel. During normal operation in an LED lit state, the forward current passes through the LED because the breakdown voltage of the Zener diode (connected in reverse) is larger than the forward voltage of the LED. In a reverse ESD pulse event, the current would pass through the Zener diode because the breakdown voltage of an LED is greater than the forward voltage of the Zener diode.

Referring to FIG. 1, method 30 continues with operation 38 in which a lens is placed over each LED die.

Referring to FIG. 8, the lens 133 is formed over the phosphor 129 to further shape an emission pattern of the emitted light with enhanced light emission efficiency. In one embodiment, the lens 133 includes epoxy, silicone or other suitable material. In one example, the lens 133 may be formed by placing a lens molding over the LED dies 10, injecting silicone into the lens molding, and curing the injected silicone. Different curing methods include, but are not limited to, heat, ultraviolet (UV), infrared (IR) or air curing. In one embodiment, the curing process for the lens 133 takes place at a temperature higher than a temperature used during the phosphor curing in operation 35. The curing process for the lens 133 may both cure the lens 133 and further solidify the phosphor 129. An example of temperature for curing lens 133 is from about 100° C. to about 150° C. for about 2 to 5 hours.

Next, referring to FIG. 1, method 30 continues with operation 39 in which each LED 10 along with the lens 133 and the carrier substrate 110 are diced into individual LED devices to complete the wafer level packaging process. In one embodiment, each of the separated LED devices includes only one LED die 10 bonded on the carrier substrate 110 and covered by the phosphor 129 and the lens 133. In another embodiment, each of the separated LED devices includes at least two LED dies 10.

FIGS. 9 to 11 are cross-sectional views of a structure 200 for forming a plurality of LED devices at various stages of manufacture according to another embodiment of the method of FIG. 1. An LED die 20 shown in FIG. 2C is incorporated in the structure 200 during manufacturing.

Referring to FIG. 2C, another embodiment of the LED die 20 is shown. The layer stack of the LED die 20 is similar to the LED die 10 shown in FIG. 2B. However, the LED die 20 does not need to define the mesa structure for the LED die.

The method fabricating LED devices continues with operation 32. The contact layer 117 is bonded to the metal bonding pad 108A of the carrier substrate 110 as shown in FIG. 9. The growth substrate 105 and the buffer layer 107 are removed from LED dies 20 of the structure 200. A top metal contact layer 124 is formed on the surface of the doped semiconductor layer 111 for each of LED dies 20 in the structure 200 to form an ohmic contact. A metal feature 126 is formed on the top metal contact layer 124 of each of the plurality of LED dies 20. The metal feature 126 is electrically connected to the doped semiconductor layer 111 as the top electrode. In one embodiment, the metal feature 126 is formed by conductive bumps, such as gold bumps, having a height of about 20 µm to about 300 µm.

The operations 33 to 35 for forming a plurality of LED devices for the structure 200 are similar to operations 33 to 35 of method 30 in the structure 100. Details of these operations can be found in text associated with the method 30 for the structure 100 and are not repeated here.

Referring now to FIG. 1, method 30 continues with operation 36 in which the phosphor and the patterned mask layer are polished to thin the phosphor, which covers each of the plurality of LED dies.

FIG. 10 illustrates the stage of operation 36 in which the structure 200 is provided. The excess phosphor 129 outside of the openings 127 and the patterned mask layer 125 is removed through a polishing process. The phosphor 129 and the mask layer 125 are thinned simultaneously to a predetermined thickness to expose a portion of the metal feature 126. During the polishing process, the phosphor 129 over each LED die 20 is confined within each opening 129. Advantageously, the openings 129 in the pattered mask layer 125 prevent the phosphor 129 from flowing over the entire carrier substrate 110 while the phosphor 129 is not hard enough during polishing process.

In one embodiment, the polishing process includes attaching the carrier substrate 110 to a handle carrier (not shown). Then, the phosphor 129 and the patterned mask layer 125 are pressed through the handle carrier to a rotating polish pad. The rotating speed of the polish pad is about 20 rpm to about 30 rpm with a 3M sand paper. This polishing process could be performed by a system, which is offered by SpeedFam.

After the polishing, a uniform thickness of the polished phosphor 125 is controlled within a range of about 10 µm to about 100 µm. The thickness uniformity of the polished phosphor 125 on each LED die 10 within the carrier substrate 110 is less than 5%. With the accurate control of the phosphor thickness and the uniformity, the LED devices on the carrier substrate 110 emit light at the same or similar wavelengths of light. This results in tightly binned LED devices on the same carrier substrate.

Method 30 continues with operation 37 in which the patterned mask layer is removed as shown in FIG. 1.

Referring to FIG. 11, the exposed portion of the metal feature 126 is wire bonded with a wire 130 to a contact pad (not shown) of the carrier substrate 110 after the patterned mask layer 125 is removed. A protection circuit 131 is optionally bonded the contact pad of the carrier substrate 110. The protection circuit 131 is parallel connected to the LED die 20. In one embodiment, the protection circuit 131 is wire connected to the contact pad (not shown) in the carrier substrate 110 and electrically connects to the LED die 20. In other embodiment, a contact pad (not shown) of the protection circuit 131 is directly bonded to the contact pad (not shown) in the carrier substrate 110. Through the interconnect routes (not shown) in the carriers substrate 110, an electrical connection loop between the LED die 10 and the protection circuit 131 is completed.

The operations 38 and 39 for forming a plurality of LED devices for the structure 200 are similar to operations 38 and 39 of method 30 in the structure 100. The operation 38 includes placing a lens on each of the plurality of LED dies. The operation 39 includes dicing through the carrier substrate into individual LED devices to complete the wafer level packaging process. Details of these operations can be found in text associated with the method 30 for the structure 100 and are not repeated here.

Various embodiments of the present disclosure may be used to improve previous LED device manufacturing processes. For example, this disclosure provides a method to accurately control the phosphor thickness evenly. With the accurate control of the phosphor thickness and the uniformity, the LED devices on the carrier substrate 110 emit light at the same or similar wavelengths of light. This results in tightly binned LED devices on the same carrier substrate. This approach is scalable to large wafers. It improves the efficiency of the process time and reduces the cost compared with coating the phosphor on each LED die individually.

Although the embodiments and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present application, processes, machines, manufacture, compositions of matter, means, methods, or steps, presently existing or later to be developed, that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed:

1. A method of fabricating a plurality of light emitting diode (LED) devices comprising:
   providing a plurality of LED dies;
   bonding the plurality of LED dies to a carrier substrate;
   forming a patterned mask layer comprising a plurality of openings on the carrier substrate, wherein each one of the plurality of LED dies is exposed through one of the plurality of openings respectively;
   filling each of the plurality of openings with a phosphor, thereby covering each of the plurality of LED dies with the phosphor;

curing the phosphor;

polishing the phosphor and the patterned mask layer to thin the phosphor covering each of the plurality of LED dies; and removing the patterned mask layer after polishing the phosphor.

2. The method of claim 1 further comprising placing a lens over each LED die and the polished phosphor after the operation of removing the patterned mask layer.

3. The method of claim 2 further comprising dicing through the carrier substrate to separate a plurality of LED devices after the operation of placing the lens.

4. The method of claim 1 further comprising forming a metal feature on each of the plurality of LED dies after the operation of bonding.

5. The method of claim 4, wherein the operation of polishing the phosphor comprises polishing the phosphor to expose a portion of the metal feature.

6. The method of claim 5 further comprising wire bonding the exposed portion of the metal feature to a contact pad of the carrier substrate after the operation of removing the patterned mask layer.

7. The method of claim 1, wherein each of the plurality of openings has a width substantially the same as a width of each of the plurality of LED dies.

8. The method of claim 1, wherein each of the plurality of openings has a width larger than a width of each of the plurality of LED dies.

9. A method of fabricating a plurality of light emitting diode (LED) devices comprising:

providing a plurality of LED dies;

bonding the plurality of LED dies to a carrier substrate;

forming a metal feature on each of the plurality of LED dies;

forming a patterned photo resist layer on the carrier substrate, the patterned photo resist comprising a plurality of openings, wherein each of the plurality of openings exposes one of the plurality of LED dies;

filling each of the plurality of openings with a phosphor, thereby covering each of the plurality of LED dies with the phosphor;

curing the phosphor to solidify the phosphor;

polishing the phosphor and the patterned photo resist layer to expose a portion of the metal feature on each of the plurality of LED dies;

removing the patterned photo resist layer; and wire bonding the exposed portion of the metal feature to a contact pad of the carrier substrate.

10. The method of claim 9 further comprising placing a lens over each LED die and the polished phosphor after the operation of wire bonding.

11. The method of claim 10 further comprising dicing through the carrier substrate to separate a plurality of LED devices after the operation of placing the lens.

12. The method of claim 9, wherein each of the plurality of openings has a width substantially the same as a width of each of the plurality of LED dies.

13. The method of claim 9, wherein each of the plurality of openings has a width larger than a width of each of the plurality of LED dies.

14. The method of claim 9, wherein the operation of polishing the phosphor and the patterned photo resist layer comprises:

attaching the carrier substrate to a handle carrier; and pressing the phosphor and the patterned photo resist layer through the handle carrier to a rotating polish pad.

15. The method of claim 9, wherein a thickness of the polished phosphor is within a range of about 10 μm to about 100 μm.

16. The method of claim 9 further comprising bonding a protection circuit to the carrier substrate, wherein the protection circuit is parallel connected to the LED die after the operation of removing the patterned photo resist layer.

17. A method of fabricating a plurality of light emitting diode (LED) devices comprising:

providing a plurality of LED dies;

bonding the plurality of LED dies to a carrier substrate;

forming a patterned mask layer comprising a plurality of openings on the carrier substrate, wherein each of the plurality of the LED dies is exposed through one the plurality of openings respectively, and each opening has a width substantially the same as a width of each LED die;

filling each of the plurality of openings with a phosphor, thereby covering each of the plurality of LED dies with the phosphor;

curing the phosphor to solidify the phosphor;

polishing the phosphor and the patterned mask layer to thin the phosphor covering each of the plurality of LED dies;

removing the patterned mask layer after polishing the phosphor;

placing a lens to cover each of the plurality of LED dies and the polished phosphor; and dicing through the carrier substrate to separate a plurality of LED devices.

18. The method of claim 17, wherein the operation of polishing the phosphor and the patterned mask layer comprises:

attaching the carrier substrate to a handle carrier; and pressing the phosphor and the patterned mask layer through the handle carrier to a rotating polish pad.

19. The method of claim 17, wherein a thickness of the polished phosphor is within a range of about 10 μm to about 100 μm.

20. The method of claim 17 further comprising bonding a protection circuit to the carrier substrate, wherein the protection circuit is parallel connected to the LED die after the operation of removing the patterned mask layer.

* * * * *